(12) United States Patent  
Lu et al.

(10) Patent No.: US 7,982,304 B2  
(45) Date of Patent: Jul. 19, 2011

(54) CHIP PACKAGE STRUCTURE

(75) Inventors: Bau-Ru Lu, Changhua County (TW); Chau-Chun Wen, Taoyuan County (TW); Da-Jung Chen, Taoyuan County (TW); Chun-Hsien Lu, Hsinchu (TW)

(73) Assignee: Cyntec Co., Ltd., Hsinchu (TW)

( * ) Notice: Subject to any disclaimer, the term of this patent is extended or adjusted under 35 U.S.C. 154(b) by 184 days.

(21) Appl. No.: 12/540,021

(22) Filed: Aug. 12, 2009

(65) Prior Publication Data  
US 2010/0117216 A1 May 13, 2010

(30) Foreign Application Priority Data  
Nov. 11, 2008 (TW) ................. 97143525 A

(51) Int. Cl.  
*H01L 23/48* (2006.01)

(52) U.S. Cl. ........ 257/692; 257/690; 257/691; 257/693; 257/698; 257/706; 257/E23.01

(58) Field of Classification Search .................. 257/690, 257/691, 692, 693, 698, 706, E23.01  
See application file for complete search history.

(56) References Cited

U.S. PATENT DOCUMENTS  
6,291,880 B1   9/2001   Ogawa et al.  
6,844,621 B2   1/2005   Morozumi et al.

FOREIGN PATENT DOCUMENTS  
JP   9-129822   5/1997  
JP   9-186269   7/1997  
JP   10-022435  1/1998  
JP   10-093015  4/1998  
JP   10-135380  5/1998

*Primary Examiner* — Tan N Tran  
(74) *Attorney, Agent, or Firm* — J.C. Patents

(57) ABSTRACT

A chip package structure including a substrate, at least one chip, a heat dissipation device, at least one first conductive bar, a molding compound, and at least one second conductive bar is provided. The chip and the heat dissipation device are respectively disposed on a first and a second surface of the substrate. The first conductive bar has two opposite end surfaces, wherein one end surface is disposed on the first surface of the substrate, the other end surface is extended away from the substrate, and a fastening slot is disposed between the two end surfaces and passes through the other end surface. The molding compound encapsulates the substrate, the chip, part of the heat dissipation device, and the first conductive bar. The second conductive bar is disposed on one surface of the molding compound and has a protrusion portion fastened to the fastening slot of the first conductive bar.

12 Claims, 4 Drawing Sheets

CHIP PACKAGE STRUCTURE

CROSS-REFERENCE TO RELATED APPLICATION

This application claims the priority benefit of Taiwan application serial no. 97143525, filed on Nov. 11, 2008. The entirety of the above-mentioned patent application is hereby incorporated by reference herein and made a part of specification.

BACKGROUND OF THE INVENTION

1. Field of the Invention

The present invention generally relates to a chip package structure, and more particularly, to a chip package structure with high voltage protection.

2. Description of Related Art

When a chip package structure with high-voltage input (for example, a power module for controlling a power supply or an IGBT module for controlling a driving motor) is designed, in order to make sure that the chip package structure meets the safety specification (for example, the UL standard) and works properly, the creepage distance and clearance distance between a voltage input terminal (for example, a lead) and a metal material (for example, a heat dissipation device) of the chip package structure are usually taken into consideration so that short circuit between the lead and the heat dissipation device is prevented and a transient high voltage input from the lead will not jump directly to a low voltage terminal (i.e., the heat dissipation device) or accordingly threaten a user's safety.

FIG. 1 is a cross-sectional view of a conventional high-power chip package structure. FIGS. 2A and 2B are cross-sectional views illustrating a fabrication process of the chip package structure in FIG. 1. Referring to FIG. 1, the conventional chip package structure 100 has a substrate 110, a plurality of chips 120, a heat dissipation device E, a plurality of leads 130, a casing 140, a silicon layer 150, and a cover 160. The substrate 110 has two surfaces 112 and 114 which are opposite to each other. The chips 120 are disposed on the surface 112, and the heat dissipation device E is disposed on the surface 114. The casing 140 is disposed on the surface 112, and the casing 140 has two surfaces 141 and 142 which are opposite to each other, an opening 143 on the surface 141, and an opening 144 on the surface 142. The opening 143 exposes a surface of the heat dissipation device E away from the substrate 110, and the opening 144 exposes the chips 120 on the substrate 110.

The leads 130 are L-shaped and pass through the casing 140. A first end 132 of each of the leads 130 is located within the opening 144, and a second end 134 of each of the leads 130 is extended out from the surface 142. The connections between the chips 120, the connections between the chips 120 and the substrate 110, and the connections between the chips 120 and the leads 130 are accomplished through a plurality of bonding wires 170. The silicon layer 150 is disposed in the opening 144 and encapsulates the chips 120 and the bonding wires 170, and the cover 160 is disposed on the silicon layer 150 and covers the opening 144.

The fabrication method of the conventional chip package structure 100 is described below. First, referring to FIG. 2A, the leads 130 are fabricated in the casing 140, wherein the leads 130 may be placed into a mold first and then formed integrally with the casing 140 through injection molding, or the casing 140 may be first formed through injection molding and the leads 130 are then embedded into the casing 140.

Next, referring to FIG. 2B, the heat dissipation device E is disposed on the surface 114 of the substrate 110, and the chips 120 are then disposed on the surface 112 of the substrate 110 and connected to the substrate 110 and to each other through wire bonding. After that, the casing 140 is disposed on the surface 112 of the substrate 110 and is adhered to the substrate 110, wherein the opening 144 of the casing 140 exposes part of the surface 112 of the substrate 110 and the chips 120, and the opening 143 of the casing 140 exposes a surface of the heat dissipation device E. Thereafter, the chips 120, the substrate 110, and the leads 130 are connected through wire bonding. Next, referring to FIG. 1 again, silica gel is filled into the opening 144 to form the silicon layer 150. Finally, the cover 160 is disposed on the silicon layer 150, and the opening 144 is sealed.

Because the leads 130 are extended out from the surface 142 and the surface 142 is opposite to the surface 141 on which the heat dissipation device E is disposed, the creepage distance and the clearance distance of the conventional chip package structure 100 are very large. As a result, the chip package structure 100 can meet the safety requirements while the chip package structure 100 has a need of high voltage input. However, the fabrication process of the conventional chip package structure 100 is very complicated, and since the casing 140 and the chips 120 are all disposed on the surface 112 of the substrate 110, the substrate 110 has very small surface area for disposing the chips 120. In order to increase the surface area of the substrate 110 for disposing the chips 120, the size of the substrate 110 has to be increased. As a result, both the cost of the substrate 110 and the volume of the chip package structure 100 are increased.

SUMMARY OF THE INVENTION

Accordingly, the present invention is directed to a chip package structure, wherein the creepage distance and the clearance distance between leads and a heat dissipation device are effectively increased so that the chip package structure can meet the safety requirements while the chip package structure has a need of high voltage input.

The present invention further provides a chip package structure, wherein the casing in the conventional technique is omitted so that the surface area of a substrate for disposing chips can be increased.

The present invention further provides a chip package structure, wherein the steps in the conventional technique for fabricating the casing and disposing the cover are omitted so that the fabrication process of the chip package structure can be simplified.

The present invention further provides a chip package structure, wherein the lead portions of the second conductive bars is prevented from contaminating by flush during a molding process, so that the chip package structure has higher fabrication yield and better electrical quality.

The present invention provides a chip package structure including a substrate, at least one chip, at least one first conductive bar, a heat dissipation device, a molding compound, and at least one second conductive bar. The substrate has a first surface and a second surface which are opposite to each other. The chip is disposed on the first surface of the substrate. The first conductive bar has two end surfaces which are opposite to each other, wherein one of the two end surfaces is disposed on the first surface of the substrate and is electrically connected to the substrate, the other end surface is extended away from the substrate, and a fastening slot is disposed between the two end surfaces and passes through the other end surface. The heat dissipation device is disposed on the second surface of the substrate. The molding compound encapsulates the substrate, the chip, part of the heat dissipation device, and the first conductive bar. The molding compound has two surfaces which are opposite to each other, wherein one of the surfaces exposes a surface of the heat dissipation device away from the substrate. The second conductive bar is disposed on the other surface of the molding compound, and the second conductive bar includes a lead portion and a protrusion portion fastened into the fastening slot of the first conductive bar.

According to an embodiment of the present invention, a first screw thread is formed on the internal wall of the fastening slot of the first conductive bar, a second screw thread corresponding to the first screw thread is formed on the sidewall of the protrusion portion of the second conductive bar, and the protrusion portion is screwed into the fastening slot.

According to an embodiment of the present invention, the second conductive bar further includes a stop portion located between the lead portion and the protrusion portion, wherein the stop portion is in direct contact with the other surface of the molding compound which is located around the second conductive bar.

According to an embodiment of the present invention, the protrusion portion of the second conductive bar is fixed into the fastening slot of the first conductive bar through tight fit fastening, tenon jointing, or adhesive bonding.

According to an embodiment of the present invention, the first conductive bar is a polygonal column, an elliptical column, or a circular column.

According to an embodiment of the present invention, at least one groove or at least one protrusion is formed on the external wall of the first conductive bar, and the molding compound is filled into the groove or encapsulates the protrusion.

According to an embodiment of the present invention, the groove is a V-shaped groove, a circular slot, a semicircular slot, or a spiral groove.

According to an embodiment of the present invention, the chip package structure further comprises an adhesive layer disposed between the protrusion portion and the fastening slot and the material of the adhesive layer comprises a conductive paste.

According to an embodiment of the present invention, the second conductive bar is directly connected to the first conductive bar.

According to an embodiment of the present invention, the lead portion is integrated with the protrusion portion.

According to an embodiment of the present invention, the lead portion is perpendicular to the other surface of the molding compound.

BRIEF DESCRIPTION OF THE DRAWINGS

The accompanying drawings are included to provide a further understanding of the invention, and are incorporated in and constitute apart of this specification. The drawings illustrate embodiments of the invention and, together with the description, serve to explain the principles of the invention.

DESCRIPTION OF THE EMBODIMENTS

Figure 1:
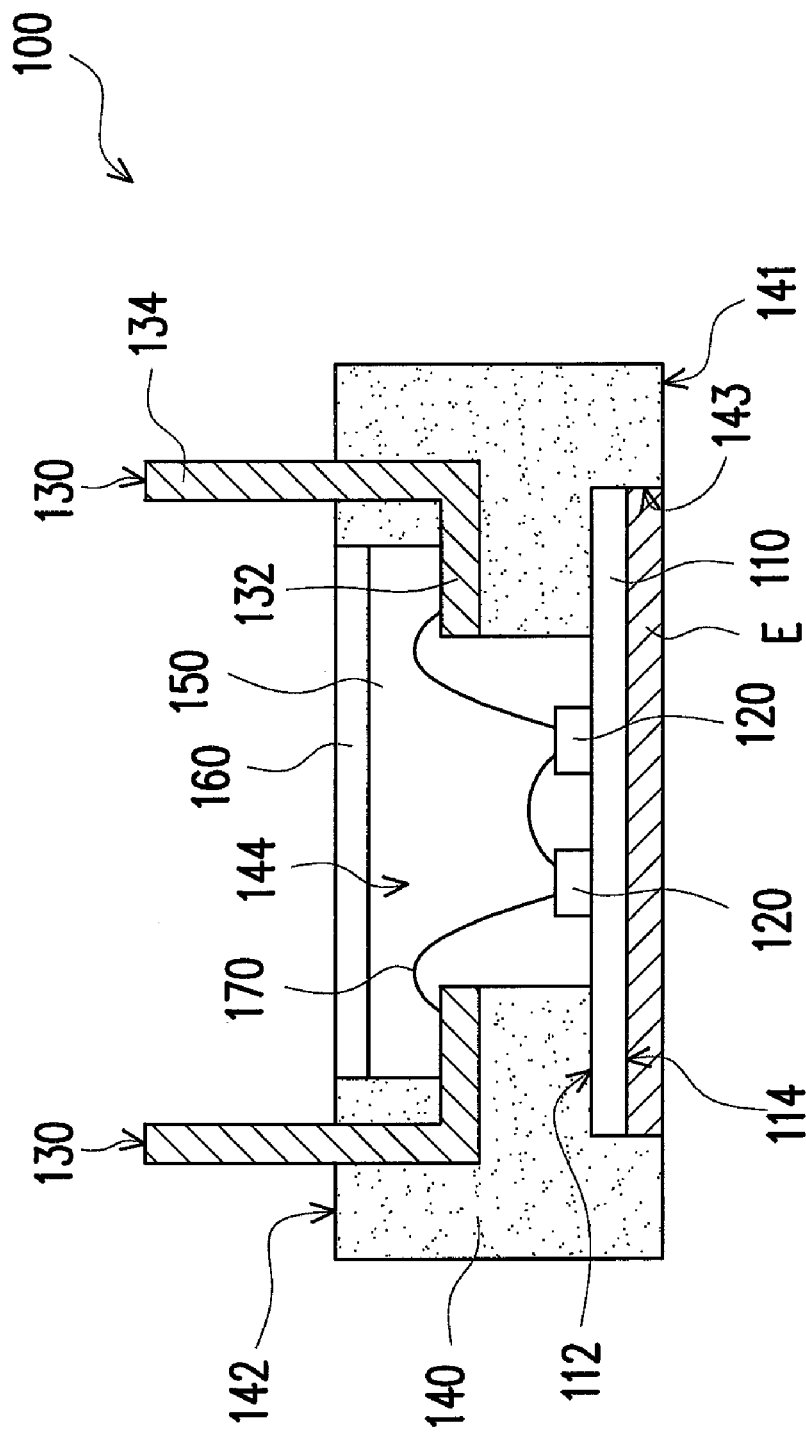
FIG. 1 is a cross-sectional view of a conventional high-power chip package structure.
Figure 2A:
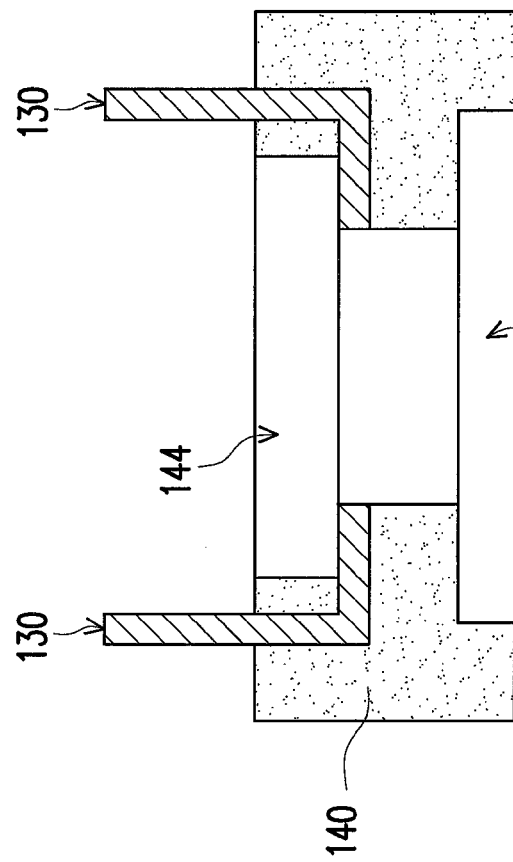
FIGS. 2A and 2B are cross-sectional views illustrating a fabrication process of the chip package structure in FIG. 1.
Figure 2B:
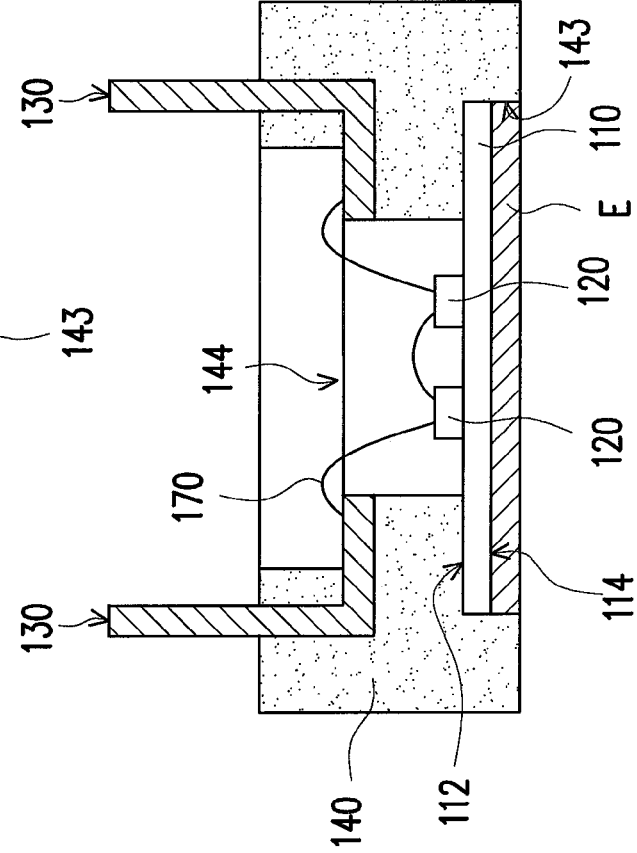

Reference will now be made in detail to the present preferred embodiments of the invention, examples of which are illustrated in the accompanying drawings. Wherever possible, the same reference numbers are used in the drawings and the description to refer to the same or like parts.

Figure 3A:
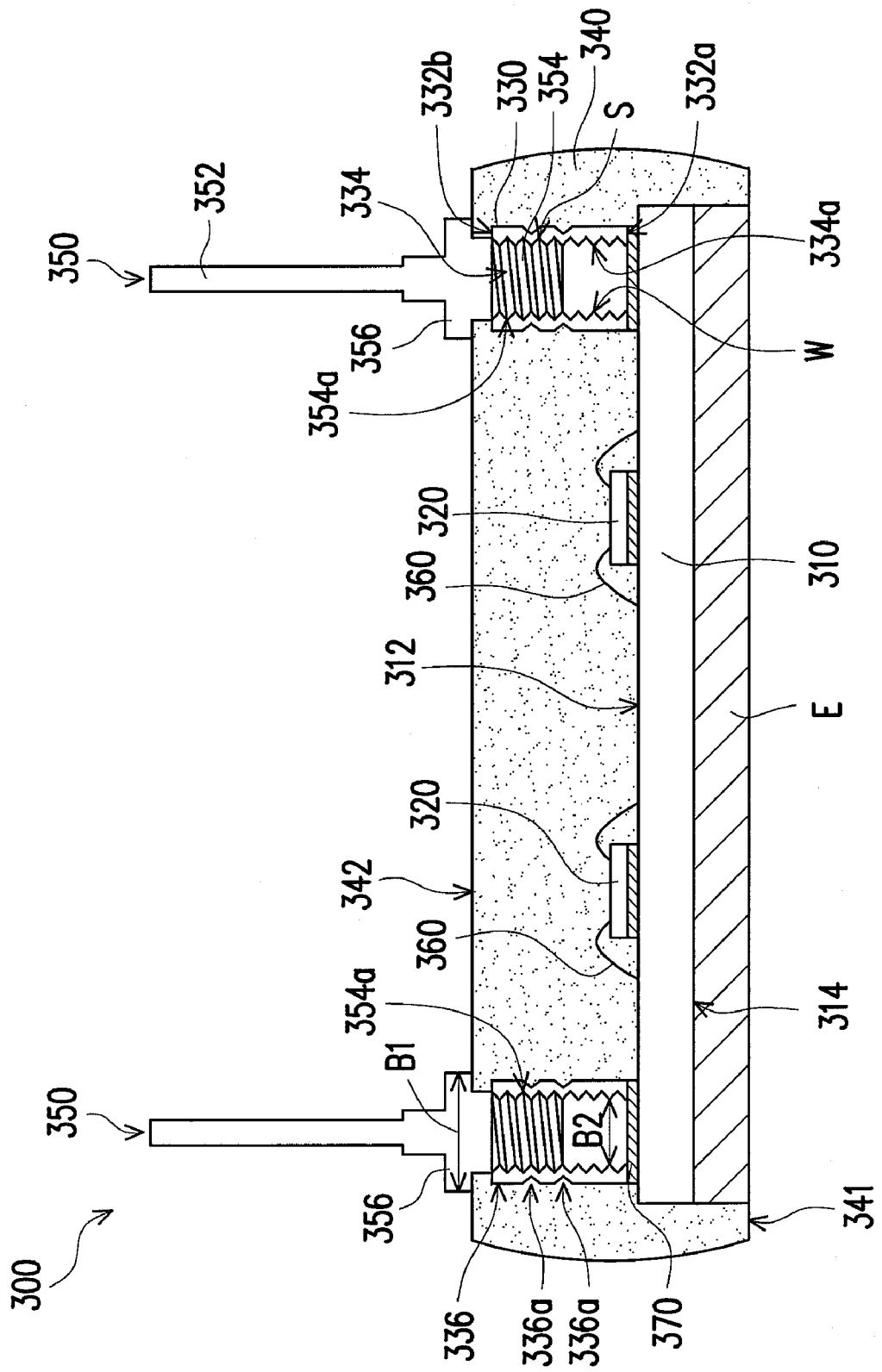
FIG. 3A is a cross-sectional view of a chip package structure according to an embodiment of the present invention.
Figure 3B:
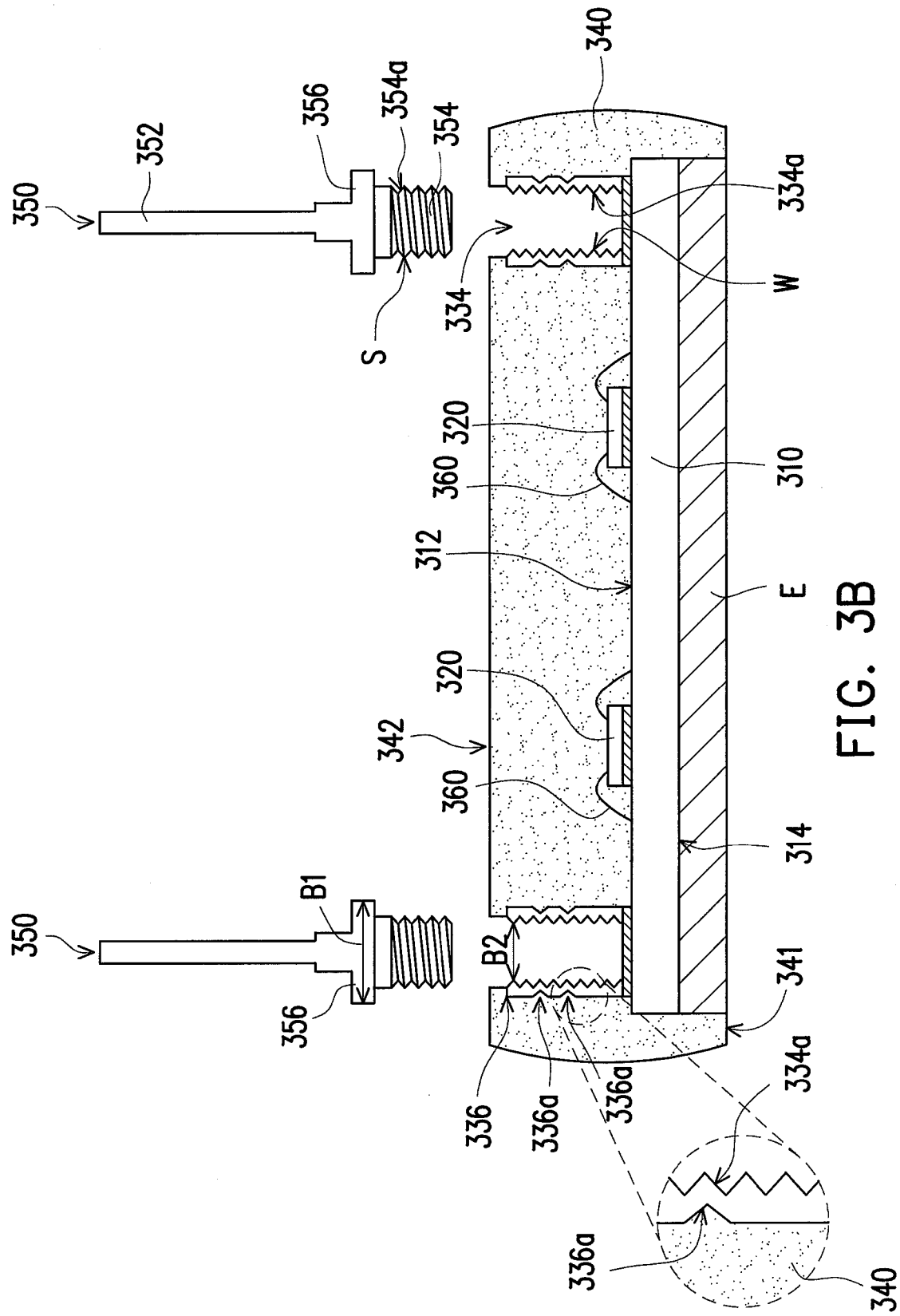
FIG. 3B is an exploded view of the chip package structure in FIG. 3A.

FIG. 3A is a cross-sectional view of a chip package structure according to an embodiment of the present invention, and FIG. 3B is an exploded view of the chip package structure in FIG. 3A. Referring to both FIG. 3A and FIG. 3B, in the present embodiment, the chip package structure 300 includes a substrate 310, a plurality of chips 320, a heat dissipation device E, a plurality of first conductive bars 330, a molding compound 340, and a plurality of second conductive bars 350.

The substrate 310 has two surfaces 312 and 314 which are opposite to each other. The substrate 310 may be a direct copper bonding substrate, a printed circuit substrate, a direct aluminium bonding substrate, an insulated metal substrate, or a lead frame.

The chips 320 are disposed on the surface 312 of the substrate 310 and are electrically connected to the substrate 310. The chips 320 may be electrically connected to the substrate 310 through wire bonding or flip chip bonding. In the present embodiment, a plurality of bonding wires 360 may electrically connect the chips 320 to the substrate 310 through wire bonding, wherein two ends of the bonding wires 360 are respectively connected to the chips 320 and the substrate 310, and the bonding wires 360 may be gold wires. The heat dissipation device E is disposed on the surface 314 of the substrate 310 to improve the heat dissipation efficiency of the chip package structure 300. The heat dissipation device E may be made of a material with high thermal conductivity, such as metal (for example, copper) or ceramic.

The first conductive bars 330 are disposed on the surface 312 of the substrate 310 and are electrically connected to the substrate 310. The first conductive bars 330 may be made of copper, aluminium, iron, or other suitable conductive materials. To be specific, a conductive layer 370 may be disposed between the first conductive bars 330 and the substrate 310, and the first conductive bars 330 and the substrate 310 may be electrically connected through welding, fixed link locking, or adhesive, and the first conductive bars 330 may be fastened onto the surface 312 of the substrate 310. In other words, in the present embodiment, the first conductive bars 330 and the chips 320 are all disposed on the surface 312. Each of the first conductive bars 330 has two end surfaces 332a and 332b which are opposite to each other, an external wall 336 which connects the two end surfaces 332a and 332b, and a fastening slot 334, wherein the end surface 332a is disposed on the surface 312, the other end surface 332b is extended away from the substrate 310, and the fastening slot 334 is disposed between the two end surfaces 332a and 332b and passes through the end surface 332b.

The molding compound 340 encapsulates the substrate 310, the chips 320, part of the heat dissipation device E, and the first conductive bars 330 and exposes the fastening slots 334 of the first conductive bars 330 and a surface of the heat dissipation device E away from the substrate 310. The molding compound 340 has two surfaces 341 and 342 which are opposite to each other, wherein the surface 341 exposes the surface of the heat dissipation device E away from the substrate 310.

The second conductive bars 350 are disposed on the surface 342 and directly connected to the first conductive bars 330, and the second conductive bars 350 pass through the surface 342 of the molding compound 340 away from the substrate 310. Each of the second conductive bars 350 includes a lead portion 352 and a protrusion portion 354. The lead portions 352 are extended from the surface 342 of the molding compound 340 for electrically connecting an external circuit (for example, a circuit board), and the protrusion portions 354 are fastened into the fastening slots 334 of the first conductive bars 330. In the present embodiment, the lead portions 352 are perpendicular to the surface 342 of the molding compound 340, and each lead portion 352 is integrated with each protrusion portion 354. To be specific, in the present embodiment, a first screw thread 334a is formed on an internal wall W of the fastening slot 334 of each of the first conductive bars 330, and a second screw thread 354a corresponding to the first screw thread 334a is formed on a sidewall S of the protrusion portion 354 of each of the second conductive bars 350, wherein the first screw thread 334a is an internal thread, the second screw thread 354a is an external thread, and the protrusion portion 354 is screwed into the fastening slot 334. In another embodiment of the present invention, the protrusion portions 354 of the second conductive bars 350 are fixed into the fastening slots 334 of the first conductive bars 330 through tight fit fastening, tenon jointing, or adhesive bonding. In the adhesive bonding method, an adhesive layer (not shown) is disposed between the protrusion portion 354 and the internal wall W of the fastening slot 334 to bond the protrusion portion 354 and the internal wall W of the fastening slot 334, wherein the material of the adhesive layer may be a conductive paste.

Since in the present embodiment, the lead portions 352 of the second conductive bars 350 are extended out from the surface 342 of the molding compound 340 and the heat dissipation device E is disposed on the surface 341 opposite to the surface 342, the creepage distance and the clearance distance between the lead portions 352 of the second conductive bars 350 and the heat dissipation device E are very large. As a result, the chip package structure 300 can meet the safety requirements while the chip package structure has a need of high voltage input.

Additionally, in order to avoid rotating or moving the first conductive bars 330 or crushing the substrate 310 when the protrusion portions 354 are screwed (or inserted) into the fastening slots 334, in the present embodiment, a plurality of grooves 336a is formed on the external walls 336 of the first conductive bars 330, and the molding compound 340 is filled into the grooves 336a. Accordingly, when the protrusion portions 354 are screwed (or inserted) into the fastening slots 334, the molding compound 340 disperses the force supplied to the fastening slots 334 by the protrusion portions 354. In the present embodiment, the grooves 336a are V-shaped grooves. In another embodiment of the present invention, the grooves 336a may also be circular slots, semicircular slots, or spiral grooves. In addition, a protrusion (not shown) may be formed on the external wall 336 of each of the first conductive bars 330, and the molding compound 340 encapsulates the protrusion. Accordingly, the molding compound 340 can disperse the force supplied to the fastening slots 334 by the protrusion portions 354 through the protrusions.

Moreover, the first conductive bars 330 may be polygonal columns (for example, hexagonal columns), elliptical columns, or circular columns. When the first conductive bars 330 are polygonal columns, the molding compound 340 can disperse the force supplied to the fastening slots 334 by the protrusion portions 354, and accordingly the first conductive bars 330 can be prevented from being screwed out when the protrusion portions 354 are screwed (or inserted) into the fastening slots 334.

Additionally, a stop portion 356 may be further disposed between the lead portion 352 and the protrusion portion 354. The stop portion 356 is in direct contact with the surface 342 of the molding compound 340 around the second conductive bars 350 so that the lead portion 352 will not enter the fastening slot 334 along with the protrusion portion 354 when the protrusion portion 354 is screwed (or inserted) into the fastening slot 334. To be specific, the maximum width B1 of the stop portion 356 is greater than the internal diameter B2 of the fastening slot 334. Thus, the stop portion 356 is leaned against the surface 342 when the protrusion portion 354 is screwed (or inserted) into the fastening slot 334.

The fabrication method of the chip package structure 300 in the present embodiment is described below. First, the first conductive bars 330 are disposed on the substrate 310. Then, a molding process is performed. Next, the second conductive bars 350 are connected to the first conductive bars 330. In other words, the second conductive bars 350 can be connected to the first conductive bars 330 after the molding process is performed. As a result, the lead portions 352 of the second conductive bars 350 can be prevented from being contaminated by flush during the molding process. Accordingly, the chip package structure 300 in the present embodiment has higher fabrication yield and better electrical quality.

As described above, the chip package structure and the fabrication method thereof provided by the present invention have at least following advantages:

1. In the present invention, the leads are extended out from a surface of the molding compound away from the substrate and the heat dissipation device E is disposed on a surface opposite to foregoing surface. Thus, the creepage distance and clearance distance between the second conductive bars and the heat dissipation device are increased.

2. The casing in the conventional technique is omitted in the present invention. Thus, the surface area of the substrate for disposing chips is increased while the size of the substrate is reduced. As a result, the cost of the substrate is reduced.

3. In the present invention, the second conductive bars can be disposed on the first conductive bars after the molding process is performed. Accordingly, the lead portions of the second conductive bars will not be contaminated by flush during the molding process. Thus, the chip package structure provided by the present invention has higher fabrication yield and better electrical quality.

4. In the present invention, the molding compound can be fabricated through only one molding process and the steps for fabricating the casing and disposing the cover in the conventional technique can be omitted. Accordingly, the fabricating process is simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
a substrate, having a first surface and a second surface opposite to each other;
at least one chip, disposed on the first surface of the substrate;
at least one first conductive bar, having two end surfaces opposite to each other, wherein one of the end surfaces is disposed on the first surface of the substrate and is electrically connected to the substrate, the other end surface is extended away from the substrate, and a fastening slot is disposed between the two end surfaces and passes through the other end surface;

a heat dissipation device, disposed on the second surface of the substrate;

a molding compound, for encapsulating the substrate, the chip, a part of the heat dissipation device, and the first conductive bar, the molding compound having two surfaces opposite to each other, wherein one of the surfaces exposes a surface of the heat dissipation device away from the substrate; and at least one second conductive bar, disposed on the other surface of the molding compound, the second conductive bar comprising a lead portion and a protrusion portion, wherein the protrusion portion of the second conductive bar is fastened into the fastening slot of the first conductive bar.

2. The chip package structure according to claim 1, wherein a first screw thread is formed on an internal wall of the fastening slot of the first conductive bar, a second screw thread corresponding to the first screw thread is formed on a sidewall of the protrusion portion of the second conductive bar, and the protrusion portion is screwed into the fastening slot.

3. The chip package structure according to claim 1, wherein the second conductive bar further comprises a stop portion located between the lead portion and the protrusion portion, and the stop portion is in direct contact with the other surface of the molding compound around the second conductive bar.

4. The chip package structure according to claim 1, wherein the protrusion portion of the second conductive bar is fixed into the fastening slot of the first conductive bar through tight fit fastening, tenon jointing, or adhesive bonding.

5. The chip package structure according to claim 1, wherein the first conductive bar is a polygonal column, an elliptical column, or a circular column.

6. The chip package structure according to claim 1, wherein at least one groove is formed on an external wall of the first conductive bar, and the molding compound is filled into the groove.

7. The chip package structure according to claim 6, wherein the groove is a V-shaped groove, a circular slot, a semicircular slot, or a spiral groove.

8. The chip package structure according to claim 1, wherein at least one protrusion is formed on an external wall of the first conductive bar, and the molding compound encapsulates the protrusion.

9. The chip package structure according to claim 1, further comprising an adhesive layer disposed between the protrusion portion and the fastening slot, wherein the material of the adhesive layer comprises a conductive paste.

10. The chip package structure according to claim 1, wherein the second conductive bar is directly connected to the first conductive bar.

11. The chip package structure according to claim 1, wherein the lead portion is integrated with the protrusion portion.

12. The chip package structure according to claim 1, wherein the lead portion is perpendicular to the other surface of the molding compound.

* * * * *